US009489856B2

(12) United States Patent
Herz

(10) Patent No.: US 9,489,856 B2
(45) Date of Patent: Nov. 8, 2016

(54) INTERACTIVE PRINTED ARTICLE WITH TOUCH-ACTIVATED PRESENTATION

(71) Applicant: SmartBound Technologies, LLC, Austin, TX (US)

(72) Inventor: Scott Austin Herz, Austin, TX (US)

(73) Assignee: SMARTBOUND TECHNOLOGIES, LLC, Austin, TX (US)

( * ) Notice: Subject to any disclaimer, the term of this patent is extended or adjusted under 35 U.S.C. 154(b) by 566 days.

(21) Appl. No.: 13/870,292

(22) Filed: Apr. 25, 2013

(65) Prior Publication Data

US 2013/0316321 A1 Nov. 28, 2013

Related U.S. Application Data

(60) Provisional application No. 61/688,924, filed on May 23, 2012, provisional application No. 61/690,411, filed on Jun. 25, 2012, provisional application No. 61/690,412, filed on Jun. 25, 2012, provisional application No. 61/690,413, filed on Jun. 25, 2012, provisional application No. 61/741,384, filed on Jul. 19, 2012.

(51) Int. Cl.
*G09B 5/00* (2006.01)
*G09B 7/00* (2006.01)
(Continued)

(52) U.S. Cl.
CPC ............... *G09B 5/06* (2013.01); *B42D 1/006* (2013.01); *B42D 1/009* (2013.01); *B42D 3/123* (2013.01);
(Continued)

(58) Field of Classification Search
CPC .......... G09B 5/00; G09B 7/00; G09B 5/062; G09B 5/065; G09B 5/06; G06F 3/044; B42D 1/006; B42D 1/009; B42D 3/123; B42D 15/022; H01H 2229/038; H03K 17/962; H03K 17/9622; H03K 17/9645; H03K 2017/9602; H03K 2217/94094; H03K 2217/960755
USPC ........................................................ 434/317
See application file for complete search history.

(56) References Cited

U.S. PATENT DOCUMENTS

| 4,636,881 A | 1/1987 | Brefka et al. |
| 4,990,092 A | 2/1991 | Cummings |

(Continued)

FOREIGN PATENT DOCUMENTS

| CN | 102693033 A | 9/2012 |
| GB | 2487579 A | 1/2012 |

(Continued)

OTHER PUBLICATIONS

Smartbound Technologies, LLC—International Application No. PCT/US2013/038174, Filing Date: Apr. 25, 2013, International Search Report dated Aug. 9, 2013.

*Primary Examiner* — Nikolai A Gishnock
(74) *Attorney, Agent, or Firm* — Brian F. Russell; Russell Ng PLLC

(57) ABSTRACT

An interactive printed article includes a cover and a plurality of printed leaves on which a plurality of touchpoints are distributed. A particular printed leaf among the plurality of printed leaves includes first and second viewed surfaces and first and second inner surfaces and has a touch sensor incorporated therein proximate to a touchpoint among the plurality of touchpoints. At least one of the first and second viewed surfaces has content printed thereon, and at least one of the first and second inner surfaces has a conductive trace formed thereon. The interactive printed article further includes an electronics package electrically coupled to the conductive trace that initiates presentation of a particular presentation corresponding to the touchpoint in response to detection via the touch sensor of selection of the touchpoint.

21 Claims, 12 Drawing Sheets

(51) Int. Cl.
    *B42D 15/00*     (2006.01)
    *H05K 3/12*     (2006.01)
    *G09B 5/06*     (2006.01)
    *H05K 3/10*     (2006.01)
    *B42D 3/12*     (2006.01)
    *B42D 15/02*     (2006.01)
    *B42D 1/00*     (2006.01)
    *H03K 17/96*     (2006.01)
    *H05K 1/03*     (2006.01)
    *G06F 3/044*     (2006.01)

(52) U.S. Cl.
    CPC ............ *B42D 15/022* (2013.01); *G09B 5/062* (2013.01); *G09B 5/065* (2013.01); *H03K 17/962* (2013.01); *H03K 17/9622* (2013.01); *H03K 17/9645* (2013.01); *H05K 3/10* (2013.01); *G06F 3/044* (2013.01); *H01H 2229/038* (2013.01); *H03K 2017/9602* (2013.01); *H03K 2217/94094* (2013.01); *H03K 2217/960755* (2013.01); *H05K 1/0386* (2013.01); *H05K 3/12* (2013.01); *Y10T 29/49124* (2015.01)

(56) References Cited

U.S. PATENT DOCUMENTS

| | | |
|---|---|---|
| 5,209,665 A | 5/1993 | Billings et al. |
| 5,290,190 A | 3/1994 | McClanahan |
| 5,417,575 A | 5/1995 | McTaggart |
| 5,538,430 A | 7/1996 | Smith et al. |
| 5,569,868 A | 10/1996 | Leung |
| 5,803,748 A | 9/1998 | Maddrell et al. |
| 5,810,604 A | 9/1998 | Kopp, Jr. et al. |
| 5,954,514 A | 9/1999 | Haas et al. |
| 6,041,215 A * | 3/2000 | Maddrell ............... G09B 5/062 345/901 |
| 6,064,855 A | 5/2000 | Ho |
| 6,491,220 B1 | 12/2002 | May |
| 6,655,586 B1 | 12/2003 | Back et al. |
| 6,729,543 B1 | 5/2004 | Arons et al. |
| 6,819,316 B2 | 11/2004 | Schulz et al. |
| 7,224,934 B2 | 5/2007 | Mullen |
| 7,868,778 B2 | 1/2011 | Kenwright |
| 8,267,309 B1 | 9/2012 | Milford et al. |
| 2010/0066071 A1 | 3/2010 | Kelaidis |
| 2010/0066702 A1 | 3/2010 | Lee et al. |
| 2010/0156840 A1 | 6/2010 | Frey et al. |
| 2010/0311489 A1* | 12/2010 | Miller ...................... A63F 1/12 463/16 |
| 2011/0212429 A1 | 9/2011 | Stone |
| 2012/0187952 A1 | 7/2012 | Coombs |

FOREIGN PATENT DOCUMENTS

| | | | |
|---|---|---|---|
| GB | 2487580 A * | 8/2012 | ......... H03K 17/9622 |
| KR | 1020120116467 A | 10/2012 | |
| WO | 2004077286 A1 | 9/2004 | |

\* cited by examiner

INTERACTIVE PRINTED ARTICLE WITH TOUCH-ACTIVATED PRESENTATION

PRIORITY CLAIM

The present application claims priority under 35 U.S.C. §119(e)(1) to the following provisional applications:
1. Ser. No. 61/688,924, filed on May 23, 2012;
2. Ser. No. 61/690,411, filed on Jun. 25, 2012;
3. Ser. No. 61/690,412, filed on Jun. 25, 2012;
4. Ser. No. 61/690,413, filed on Jun. 25, 2012; and
5. Ser. No. 61/741,384, filed on Jul. 19, 2012, the contents of which are incorporated herein by reference.

BACKGROUND

The present invention relates to printed articles in general, and in particular to an interactive printed article with a touch-activated presentation.

Interactive printed books generally include multiple physical pages of printed material (such as text and pictures) along with pertinent electronic circuitry to play back various pre-recorded audio tracks. Such interactive printed books may have activation mechanisms that are autonomous or activated by user interaction with the book content.

Interactive printed books having autonomous activation mechanisms may utilize a series of sensors and receivers to detect the turning of a physical page of the book, and some designs utilize resistive flexor sensors to identify a particular page. Some designs alternatively utilize embedded radio frequency identification (RFID) tags in each physical page and a sensor on the book binding to determine which audio track to play. Interactive printed books that employ the above-mentioned autonomous activation mechanisms may require thicker pages made of laminated paperboard (and for this reason referred to as "board books") or may require the reader to hold or orient the book in a particular manner, which may distract the user from the book content and the desired immersive environment provided by the audio tracks and thus negatively impact the user's experience. Further, the market for board books is nearly entirely limited to young children, restricting the ability of authors and publishers to develop and market interactive printed books for the mass market or for other market segments.

Moreover, current autonomous activation mechanisms provide only for the recognition of the pair of physical pages to which the printed book is open. If a user wants to replay the audio track associated with a given page, the user has to turn to a different page and then turn back to the given page. When turning to the other page, the user will likely activate a different audio track than the user desires to hear presented. Alternatively, the user may be able to close the book and reopen to the desired page to cause the desired audio track to be replayed. Regardless of which method is employed, the reader is inconvenienced, and the continuity of the user's experience is interrupted.

Additionally, current autonomous activation mechanisms make it difficult to associate more than one audio track with a given pair of physical pages. This limitation is a particular disadvantage, for example, for educational books in which it would be desirable to associate specific media tracks with different features of the same physical page. Examples of such educational books that do not currently exist might include, for example, a reading primer that allows the user to listen to a voice reading a particular line of text or a musical instruction book that plays a sequence of measures in one of the lines of music printed on a page.

Further, current autonomous activation mechanisms do not give the user a convenient way to not play the audio track associated with a given page or to delay the playing of the audio track. Consequently, to extend the foregoing educational book examples, it would be difficult for a beginning reader or musician to attempt to read the words or play the music on a given page prior to hearing the corresponding track play the corresponding audio track.

Interactive printed books that rely on user interaction to trigger presentation of an audio track commonly provide pressure-sensitive switches in the binding or cover of the book. In one design, the back cover of the book has an array of switches and corresponding indicia on the physical pages of the book that are aligned with the switches on the back cover. When the user manually presses on an indicia on a given page, pressure is transferred through the pages of the book to activate the associated switch and play the selected audio track. This arrangement is inconvenient because it requires the user to hold the book in a specific position or on a flat surface to assure that the proper switch is activated. Furthermore, the number of switches and number of pages is limited by the precision with which pressure can be reliably transferred through the pages to the desired switch on the cover.

In other designs of interactive printed books having non-autonomous activation mechanisms, pressure-sensitive switches are located in the pages themselves. While supporting more precise selection of audio tracks, audio books having pressure-sensitive switches incorporated into the physical pages of the book require significantly thicker pages than those in an ordinary printed book (e.g., laminated paperboard pages), thereby increasing the size of the book and the cost of materials and decreasing the number of pages that can reasonably be included in the book. Further, care must be taken to distribute the pressure-sensitive switches so that a user pressing on a switch on one page does not inadvertently activate a switch on another underlying page.

In view of the foregoing, it would be desirable to provide an improved touch-activated interactive printed book that offers a user-friendly and intuitive experience and that can be manufactured with a form factor and page thickness similar to standard non-interactive printed books.

SUMMARY OF THE INVENTION

In one embodiment, an interactive printed article includes a cover and a plurality of printed leaves on which a plurality of touchpoints are distributed. A particular printed leaf among the plurality of printed leaves includes first and second viewed surfaces and first and second inner surfaces and has a touch sensor incorporated therein proximate to a touchpoint among the plurality of touchpoints. At least one of the first and second viewed surfaces has content printed thereon, and at least one of the first and second inner surfaces has a conductive trace formed thereon. The interactive printed article further includes an electronics package electrically coupled to the conductive trace that initiates presentation of a particular presentation corresponding to the touchpoint in response to detection via the touch sensor of selection of the touchpoint.

The above summary contains simplifications, generalizations and omissions of detail and is not intended as a comprehensive description of the claimed subject matter but, rather, is intended to provide a brief overview of some of the features and functionality associated therewith. Other systems, methods, functionality, features and advantages of the claimed subject matter will be or will become apparent to one with skill in the art upon examination of the following figures and detailed written description.

DETAILED DESCRIPTION OF A PREFERRED EMBODIMENT

Figure 1:
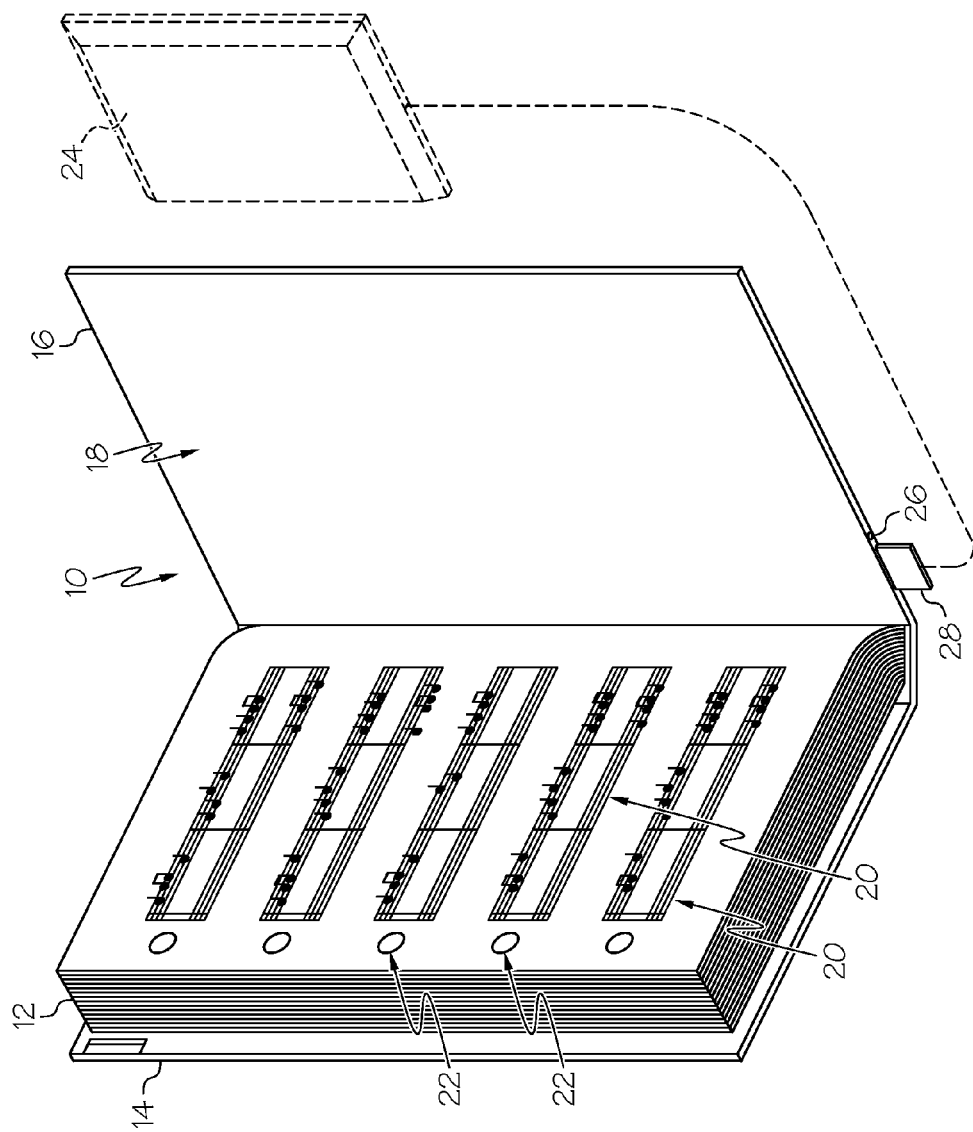
FIG. 1 illustrates an exemplary embodiment of an interactive printed book.

Referring now to the drawings and in particular to FIG. 1, an exemplary interactive printed article, referred to herein as interactive printed book 10, in accordance with a preferred embodiment of the present invention is illustrated. As shown, interactive printed book 10 includes multiple physical printed leaves 12 (collectively referred to in the art of bookbinding as the "book block") bound between a front cover 14 and a back cover 16. In the case of a hardcover book, covers 14, 16 may be made from conventional bookboards, and may be wrapped with a decorative or protective cover, such as paper, cloth, leather or plastic, and may be covered on their inside surfaces with endleaves 18. In other embodiments, interactive printed book 10 may be bound with an alternative binding (e.g., Japanese stab binding, thermal binding, perfect binding, etc.), and one or both of covers 14 and 16 may be made of other materials, including softcover.

Leaves 12 may be made of, for example, paper, plastic, cardboard, cardstock, foam, bookboards, or other dielectric material(s). The viewable faces (i.e., pages) of leaves 12 may contain printed content 20 of any kind, including text, pictures, graphics, or as shown, a musical score. Associated with content 20 are touchpoints 22, which as defined herein, are indicia of the location(s) on or in the leaf 12 of touch sensors that can selectively be activated based on the resistive, capacitive and/or conductive properties of a user's finger (or stylus). As described in greater detail herein, the touch and/or proximity of a user's finger (or stylus) at a touchpoint 22 causes an electronics package incorporated within interactive printed book 10 to initiate a presentation to the user. The presentation can include, without limitation, audio, video, lighting, luminescence (e.g., by applying a sufficient voltage to electro luminescent ink), vibration, data transfer (including loading a webpage or website) or a combination thereof. The presentation can be presented by the electronics package incorporated within interactive printed book 10, and may alternatively or additionally be partially or fully presented by an external electronic device 24. External electronic devices 24 that may be utilized to partially or fully present a presentation include, without limitation, external speakers, headphones, smartphones, tablet computers, laptop computers, printers, etc. External electronic devices 24 can be coupled to interactive printed book 10 via an audio jack 26, a data port 28 (e.g., USB, serial or Apple® dock port), and/or a wireless interface (e.g., IEEE 802.1x, Bluetooth®, 900 MHz, CDMA, GSM, etc.).

Figure 2:
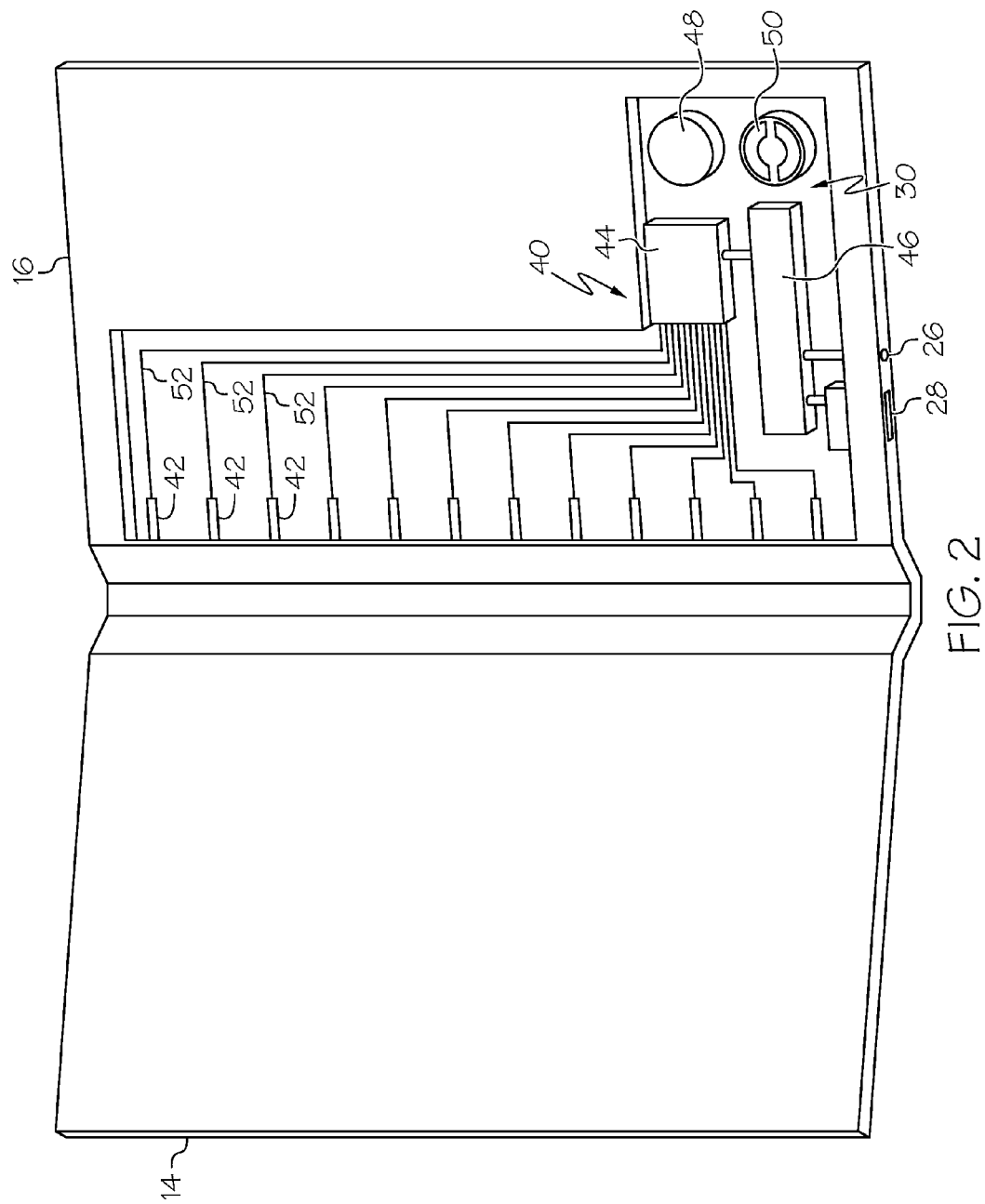
FIG. 2 depicts a case of an interactive printed book including an electronics package in accordance one embodiment.

Referring now to FIG. 2, there is depicted a more detailed view of one embodiment of the case of interactive printed book 10 shown with the book block and endleaves 18 removed. In the depicted embodiment, back cover 16 has formed therein a recess 30, which houses an electronics package 40. Electronics package 40 includes a microcontroller 44, an audio controller 46, the data port 28 and audio jack 26 previously noted in FIG. 1, a speaker 50, and one or more batteries 48 powering electronics package 40. The functions of microcontroller 44 and audio controller 46 can be implemented, for example, in integrated circuitry, by a collection of programmable gates (e.g., FPGA), in firmware and/or software (which may be stored in internal or external memory (e.g., EEPROM, flash memory, etc.)), or in a combination thereof. In at least some embodiments, the functions of microcontroller 44 and audio controller 46 can further be implemented using a single physical controller.

Figure 3:
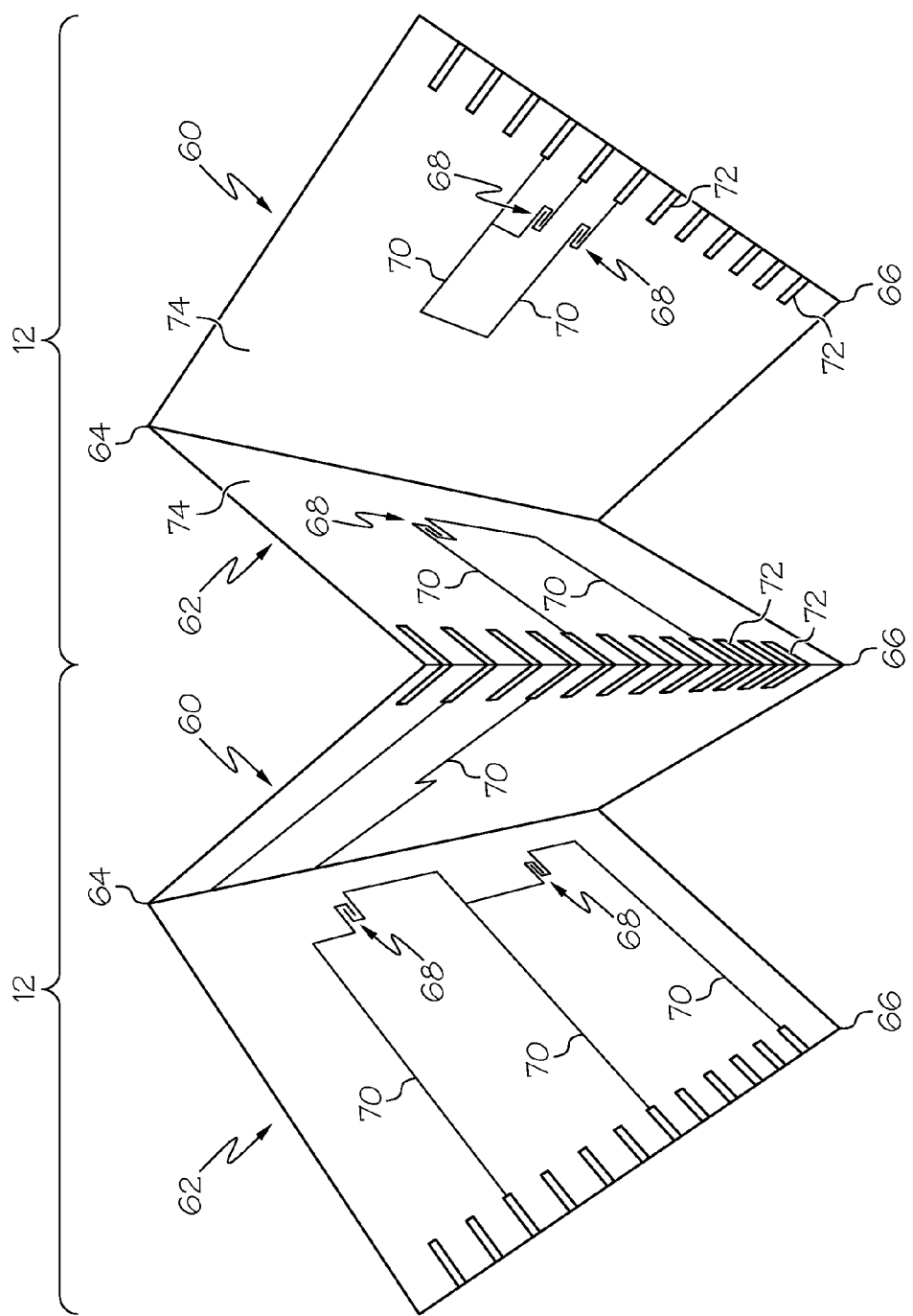
FIG. 3 illustrates one embodiment of the construction of the leaves of an interactive printed book in which conductive traces are formed on the hidden inner surfaces of the leaves.

Microcontroller 44 of electronics package 40 is coupled by conductive traces 52 and book block connectors 42 to circuitry embedded within the book block. For example, as depicted in FIG. 3 and as described below, each of the book block connectors 42 may correspond to and electrically connect to a respective conductive pad 72 on the bound (spine) edge 66 of one or more of leaves 12. In some embodiments, book block connectors 42 and conductive traces 52 together form a flex connector that may be printed with conductive ink directly on a sheet of paper or other dielectric material. In some cases, this flex connector may form (or electrically connect to) the final page of the book block. In other cases, the book block connectors 42 of the flex connector may extend between conductive pads 72 on the internal surfaces 74 of a leaf 12. In other embodiments, book block connectors 42 may be connected to conductive pads of one or more leaves 12 using flexible foils, wires, flat wires, ribbon cables or other electrical connections known to those skilled in the art.

In at least some embodiments, electronics package 40 may be manufactured as a separate module that physically mates with a connector provided in interactive printed book 10. In this manner, electronics package 40 may be packaged and sold separately from interactive printed book 10. Further, with appropriate programming, a module containing an electronics package 40 may be utilized with multiple different interactive printed books 10 having differing content 20, reducing the overall cost of a library of compatible interactive printed books 10.

In use, electronics package 40 is brought from a powered-off state or low power mode to an active mode, for example, by the installation of a battery 48 via an access panel into recess 30 or by a user actuating an unillustrated switch or sensor. In one example, electronics package 40 transitions from a low power deep sleep mode to the active mode in response to user selection of a capacitive or resistive touch sensor within the book block, as described further below. In another example, electronics package 40 is brought to the active mode by the user selecting the "on" position of a physical switch, which in one particular embodiment, can be activated by the user simply opening front cover 14 of interactive printed book 10. Once placed in the active mode, microcontroller 44 detects selections of touchpoints 22 and initiates presentations corresponding to the particular touchpoints 22 selected by the user. For example, in the depicted embodiment, microcontroller 44 may initiate at least one presentation by triggering playback of an audio track (e.g., a digital audio file) by audio controller 46 via speaker 50, or if an external device 24 such as an external speaker or a set of headphones is connected via audio jack 26, via the external device 24 rather than the speaker 50. In at least some embodiments, presentation parameters, such as presentation volume, presentation language and presentation timing, can further be controlled by the user's selection of one or more physical switches or touch sensors.

With reference now to FIG. 3, there is illustrated one embodiment of the construction of the leaves 12 an interactive printed book 10 in which conductive traces are formed on the hidden inner surfaces of the leaves 12. In the illustrated embodiment, each leaf 12 is formed of a folded sheet of material (e.g., paper or other dielectric material). The viewed faces or pages of leaves 12 include a recto 60 and verso 62 that are joined at a free edge 64. As shown, in at least some embodiments, one or more of leaves 12 may further be joined at bound edge 66.

On recto 60 and/or verso 62, content 20 and touchpoints 22 are printed in a conventional manner, preferably with ordinary, non-conductive ink. In some embodiments, at least some of content 20 and/or touchpoints 22 may alternatively or additionally be printed using electroluminescent or other special inks. On internal surfaces 74 of leaves 12, touch sensors 68 are formed at locations corresponding to touchpoints 22. In addition, conductive pads 72 electrically connected to book block connectors 42, and conductive traces 70 electrically connecting selected touch sensors 68 and conductive pads 72 are formed on one or more of the internal surfaces 74 of leaves 12. In a preferred embodiment, touch sensors 68, conductive pads 72, and conductive traces 70 are all printed on internal surfaces 74 using conductive ink. Examples of conductive inks that are formulated for use on paper include those produced by Vorbeck Materials Corporation, Creative Materials Inc., and many others. These inks may be applied via gravure, screen printing, flexographic, inkjet and other technologies and are well suited for high volume production. Alternatively, one or more of touch sensors 68, conductive traces 70 and/or conductive pads 72 may be constructed by any other material that is thin and conductive, such as conductive adhesives, paints or foils. Because leaves 12 may be creased, it is desirable to use a conductive material that maintains its conductivity after being creased.

In embodiments in which uninsulated conductive material, such as an ink, foils, adhesive or paint is employed, it is preferred to separate conductive traces 70 except at touch sensors 68 to prevent unintended activations. Further, care is preferably taken in routing conductive traces 70 to assure conductive traces 70 on the internal surfaces 74 of the same leaf 12 do not cross to avoid shorting the circuit. However, conductive traces 70 on the internal surfaces 74 of the same leaf 12 can be allowed to cross by covering at least one of the crossing conductive traces 70 with an electrical insulator, such as a tape, adhesive, coating, or non-conductive ink.

To produce an interactive printed book 10 in which leaves 12 are all connected at free edges 64 as shown in FIG. 3, the entire book block may be printed on a single sheet of continuous material. Depending on the capabilities of the printing equipment, the surfaces of the sheet may be printed in one pass or two passes. The sheet may be accordion-folded as shown in FIG. 3 before, during, or after the sheet passes through the printing equipment. The accordion-folding desirably hides touch sensors 68, conductive traces 70 and conductive pads 72 from view of the user, while providing a reliable and simple mechanism for electrically connecting touch sensors 68 to microcontroller 44 via the stacks of corresponding conductive pads 72 and book block connectors 42. (As mentioned above, the conductive traces 70 of each leaf 12 may alternatively be coupled to the electronics package disposed in one of the covers 14, 16 of interactive printed book 10 via conductive foil, wires, flat wires or other methods known to those skilled in the art.)

During or after the process of accordion-folding the sheet to form individual leaves 12, a conventional adhesive may be applied (e.g., by rolling or more preferably by spraying) to one or more locations on internal surfaces 74, and the accordion-like structure can be pressed together to achieve a strong bond between the internal surfaces 74 of each leaf 12. As will be appreciated, each resulting leaf 12 will have approximately twice the thickness of the original sheet of material. However, if desired, relatively thin material can be employed such that the thickness of leaves 12 does not detract from the user experience.

It should be noted that the corresponding conductive pads 72 of all leaves 12 need not be electrically connected by alignment and contact as would be the case in the arrangement specifically illustrated in FIG. 3. Instead, one or more of conductive pads 72 may be electrically connected to aligned or unaligned conductive pads 72 on other leaves 12 and/or to book block connectors 42 utilizing a conductive adhesive coating or foil ribbon bridging the bound edges 66 of one or more leaves 12. This variation also enables fewer than the maximum number of conductive pads 72 to be printed on a given leaf 12 (e.g., only the number of conductive pads 72 needed to support the touch sensor(s) 68 present on that leaf 12).

Figure 4:
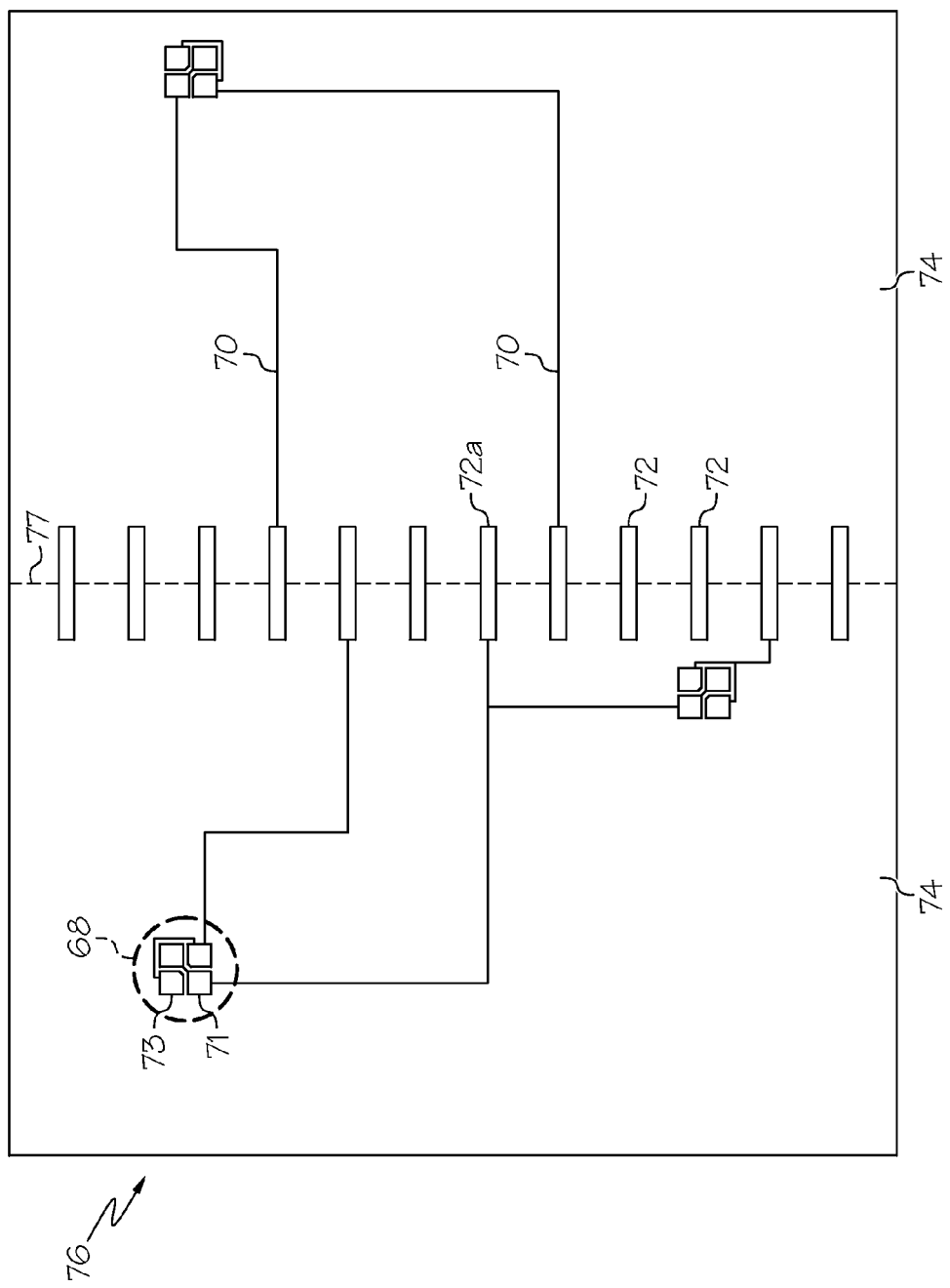
FIG. 4 depicts another embodiment of the construction of the leaves of an interactive printed book in which conductive traces are formed on the hidden inner surfaces of the leaves.

Referring now to FIG. 4, there is depicted a plan view of a sheet 76 suitable for use in constructing the leaves 12 of an interactive printed book 10 in which conductive traces are printed on the hidden inner surfaces 74 of the leaves 12. As indicated, sheet 76 has a central axis 77 defining two halves, with each half of the illustrated side of sheet 76 forming the internal surface 74 of a different leaf 12 of an interactive printed book 10. Thus, in this embodiment, the leaves 12 of an interactive printed book 10 can be formed by using adhesive to join multiple sheets 76, preferably after forming circuitry on the internal surfaces 74 and printing content 20 on the visible surfaces 60, 62 (not shown) of the sheets 76.

As in the embodiment of FIG. 3, the circuitry formed on internal surfaces 74 of sheet 76 includes touch sensors 68, conductive pads 72, and conductive traces 70 electrically connecting selected touch sensors 68 and conductive pads 72. Again, such circuitry is preferably formed by printing the circuitry on sheet 76 using conductive ink, but can alternatively or additionally be formed using conductive adhesives, paints or foils. Like FIG. 3, FIG. 4 depicts an embodiment in which each touch sensor 68 is formed of two electrodes 71, 73, with each electrode 71 or 73 of a given touch sensor 68 being electrically connected by a conductive trace 70 to different conductive pad 72. Although in the depicted embodiment, each electrode 71 or 73 is formed of two interconnected square pads, it should be appreciated that any number of diverse physical configurations of electrodes could alternatively or additionally be employed, including dots, mazes, swirls, combs (e.g., Es), etc. In a preferred embodiment, electronics package 40 must detect selection of (i.e., touch or proximity to) both electrodes 71, 73 of a touch sensor 68 in order to initiate the corresponding presentation. The use of multiple electrodes per touchpoint 22 in this manner reduces unintended activations and increases the number of touchpoints 22 that may be supported with a limited number of conductive pads 72 in that each unique combination of conductive pads 72 through which a touch is sensed can correspond to a different presentation. Said differently, the reuse of conductive pads 72, such as conductive pad 72a, to support electrodes 71 or 73 of different touch sensors 68 dramatically increases the number of touchpoints 22 whose selection can be individually detected with a given number of conductive pads 72.

Figure 12:
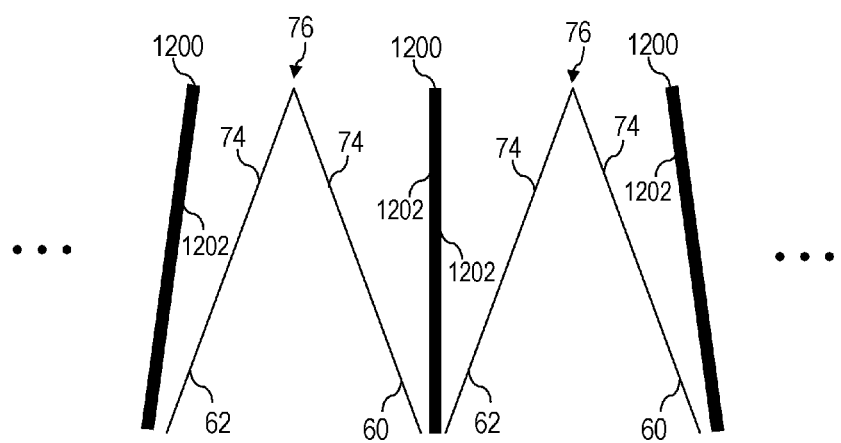
FIG. 12 depicts another embodiment of the construction of the leaves of an interactive printed book.

In another embodiment shown in FIG. 12, the leaves of the book may be constructed from materials that are thicker than paper, such as cardboard or board with a foam core. Such books are commonly referred to as "board books" and are often intended for very young children. The thicker materials are often more durable than paper and sometimes easier for a very young child to manipulate. In this embodiment, the touch sensors 68, conductive pads 72, and conductive traces 70 may be printed directly on surfaces 1202 of "boards" 1200 or on a sheet that is then adhered to boards 1200. In the specific example given in FIG. 12 the textual and graphical content of two pages of the board book is printed on the viewable surface of one sheet 76 that is folded in half and then adhered to "boards" 1100 to form a recto 60 and verso 62. The touch sensors 68, conductive pads 72, and conductive traces 70 can be printed on and/or adhered to internal surfaces 74 of sheets 76 and/or surfaces 1202 of boards 1200. To connect conductive pads 72 on the sheets 76 to the circuitry in the back of the book, conductive material may also be adhered to the boards at points near the spine of the book corresponding to where the conductive pads 72 on sheets 76 are located. The conductive material routes along the bound edge of the board 1200 such that the front and back surfaces of the board 1200 have a continuous conductive path. In this way successive leaves can be connected and eventually paths can be formed to the front or back cover of the book. Alternatively, each leaf may be routed directly to the electronics package 40 via conductive foil, wires, flat wires or other conductors known to those skilled in the art.

Figure 5:
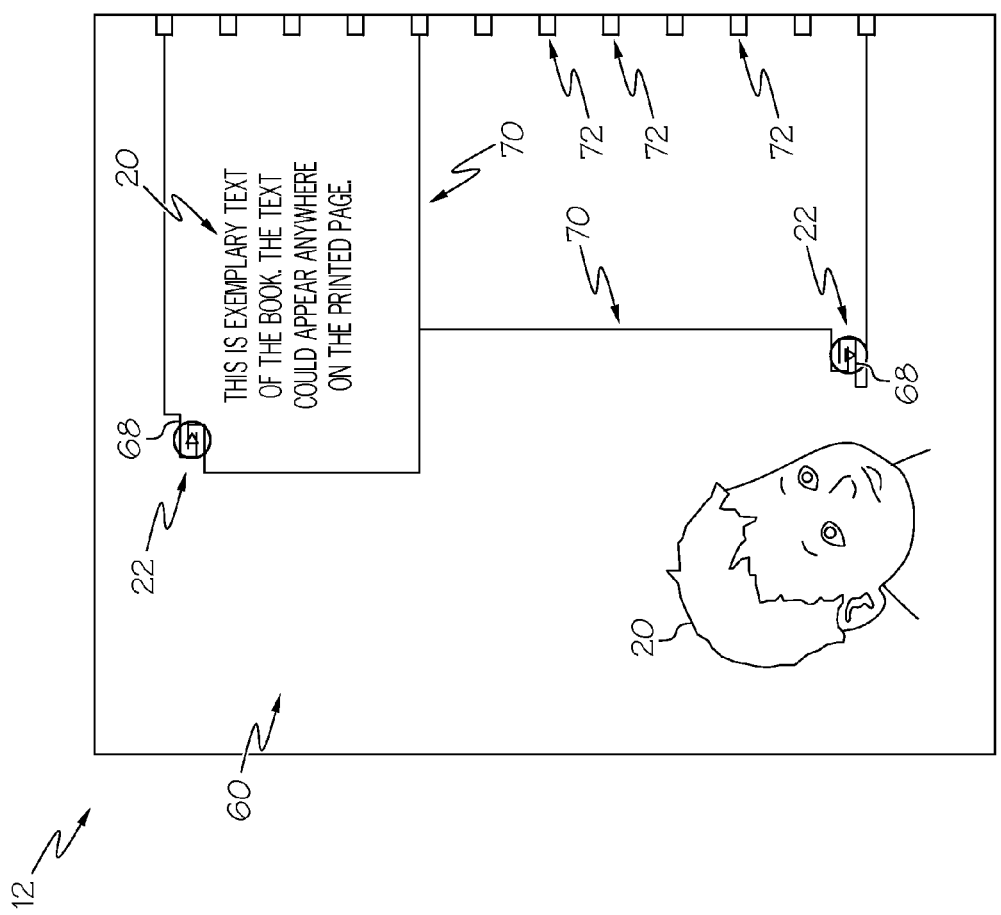
FIG. 5 illustrates another embodiment of a leaf of an interactive printed book in which conductive traces are printed on the viewed face of the leaf.

With reference now to FIG. 5, there is illustrated an alternative embodiment of a leaf 12 of an interactive printed book 10 in which conductive traces 70 are printed on the viewed face of the leaf 12. In FIG. 5, recto 60 of a leaf 12 is shown. Recto 60 has printed thereon textual and graphical content 20. In addition, recto 60 has touch sensors 68, conductive traces 70 and conductive pads 72 formed thereon as previously described with reference to FIGS. 3-4. Thus, in contrast to the embodiment of FIGS. 3-4, content 20 is printed on the same viewed face of leaf 12 as touch sensors 68, conductive traces 70 and conductive pads 72. As will be appreciated, the collocation of circuitry on the same surface of leaf 12 as content 20, while potentially simplifying the printing process, exposes the circuitry to view and wear, possibly reducing the useful life of interactive printed book 10 and its aesthetic appeal.

In various embodiments, the touch sensors 68 incorporated within the leaves 12 of an interactive printed book 10 can be implemented utilizing one or more classes of touch sensors, including capacitive touch sensors, resistive touch sensors, and projected capacitance touch sensors. Further, for capacitive touch sensors 68, microcontroller 44 can detect a selection based on self-capacitance, mutual capacitance, or a combination thereof. Depending on the design and/or capabilities of microcontroller 44, the capacitance and/or change in capacitance of an electrode 68 may further be directly sensed or may be inferred from other quantities such as voltage and charge or their derivatives.

Figure 6:
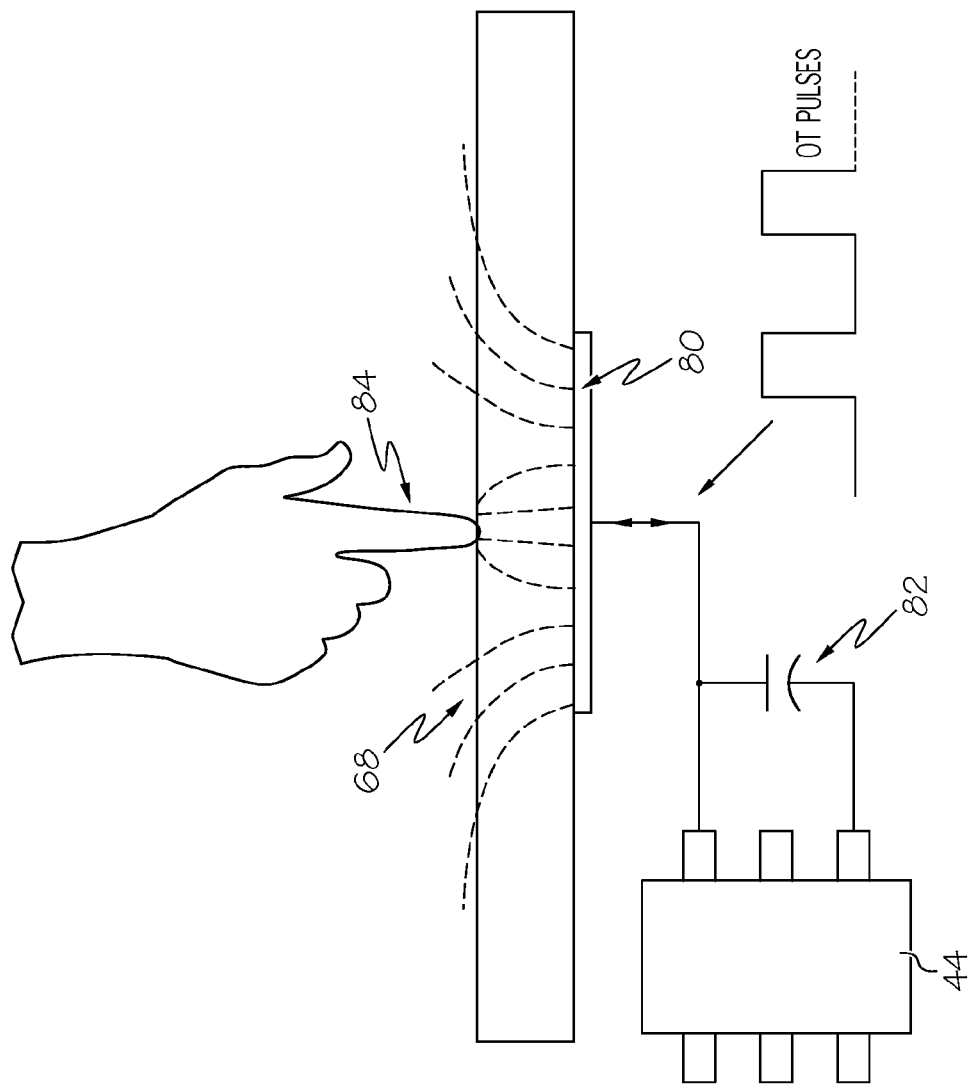
FIG. 6 illustrates an exemplary touch sensor arrangement for capacitive touch sensing.

With reference now to FIG. 6, there is illustrated an exemplary touch sensor arrangement adapted for capacitive touch sensing using self-capacitance. Initially, microcontroller 44 charges one electrode 80 of a touch sensor 68 having an unknown capacitance to a known potential (voltage). The resulting charge is transferred to a capacitor 82 (which may be internal to microcontroller 44 but is illustrated separately for clarity). Microcontroller 44 repeats this charging cycle until the voltage across capacitor 82 reaches a voltage $V_{ih}$ and records the baseline number of charging cycles required to reach voltage $V_{ih}$. When a user places a conductive object 84 (e.g., a finger or stylus) over electrode 80 (i.e., on or near a touchpoint 22), the object 84 introduces external capacitance that increases the amount of charge transferred to capacitor 82 during each charging cycle, thus reducing the total number of charging cycles required for capacitor 82 to reach voltage $V_{ih}$. In response to the number of charging cycles decreasing below the baseline by at least a predetermined amount, microcontroller 44 senses selection of the touchpoint 22 and initiates presentation of the particular presentation corresponding to the touchpoint 22.

In an alternative embodiment employing mutual capacitance, a send pin and a receive pin of microcontroller 44 are coupled to two spaced apart electrodes of a capacitive touch sensor 68. Microcontroller 44 sets the send pin to a new state and increments a counter until the receive pin transitions to the same state as the send pin. The count value recorded in the counter can be used as a baseline to detect selection of the associated touchpoint 22. In particular, selection of the touchpoint 22 varies (e.g., decreases) the mutual capacitance of the circuit loop, thus varying the count value required for the receive pin to change states and indicating selection of the associated touchpoint 22. In at least some embodiments, microcontroller 44 periodically cycles through its I/O pins, varying which pins serve as send and receive pins, thus enabling sensing for the touch sensors 68 electrically connected to each unique pair of conductive pads 72.

Figure 7:
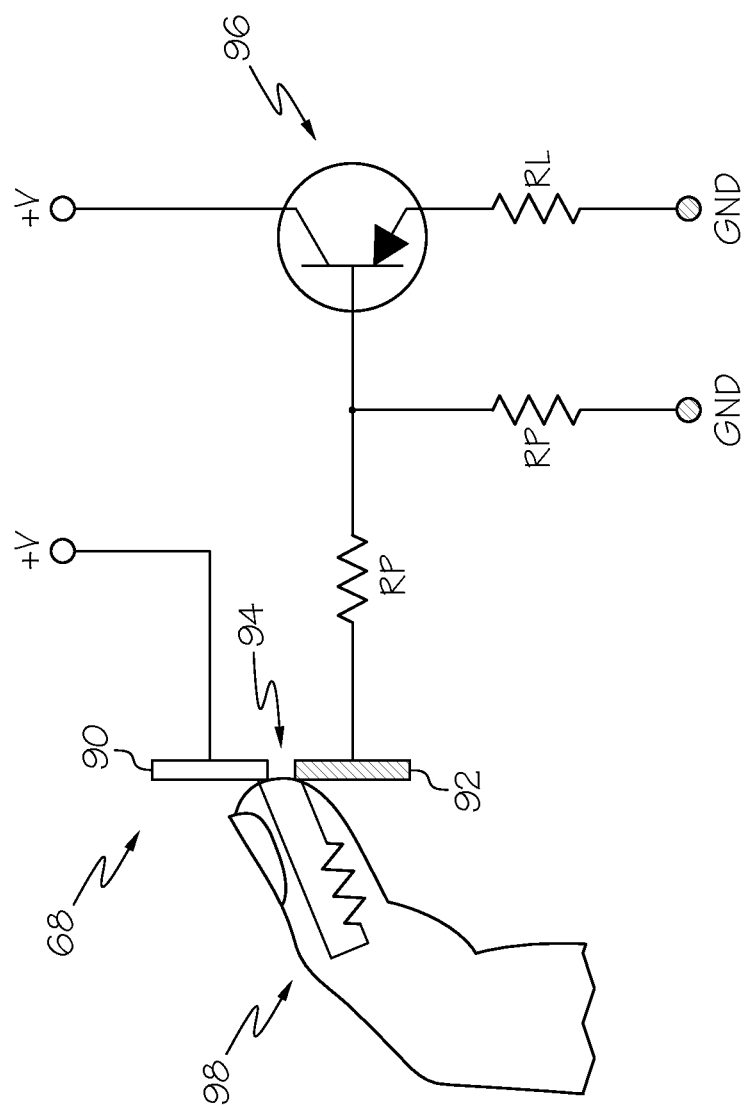
FIG. 7 depicts an exemplary touch sensor arrangement for resistive touch sensing.

Referring now to FIG. 7, there is depicted another exemplary touch sensor arrangement adapted for resistive touch sensing. In the illustrated embodiment, touch sensor 68 includes two electrodes 90 and 92 spaced by a gap 94. Touch sensor 68 is coupled to a simple transistor-based sensor circuit that can be implemented within microcontroller 44 or in external integrated or discrete circuitry. In particular, electrode 90 is coupled to the high potential node V+ of a power supply, and electrode 92 is coupled via resistors RP and RB to a low potential node (GND) of the power supply. The connection between resistors RP and RB is further coupled to the base of a transistor 96 (which is shown as a NPN-type bipolar junction transistor (BJT), but could alternatively be implemented in complementary metal-oxide-semiconductor (CMOS) technology). The collector of transistor 96 is coupled to high potential node V+, and the emitter of transistor 96 is coupled to the low potential node via a load represented as a resistor RL.

With the depicted arrangement, contact of a conductive object 98 (e.g., finger or stylus) with only one of electrodes 90, 92 does not complete the circuit and consequently has no effect. However, if conductive object 98 contacts both of electrodes 90 and 92, then a small amount of current will flow through the conductive object 98 to the base of transistor 96. Transistor 96 will consequently transition from cut-off to saturation, and current will flow through resistor RL, enabling current or voltage-based detection of the touch by microcontroller 44.

As indicated by the foregoing discussion, resistive touch sensing differs from capacitive touch sensing in that capacitive touch sensing does not require physical contact of the finger or stylus with the touch sensor 68 (close proximity is sufficient), while resistive touch sensing requires electrical connectivity between the finger or stylus and the touch sensor 68. In one implementation utilizing resistive touch sensing, such connectivity is facilitated by perforating the viewed face of a leaf 12 to expose a touch sensor 68 printed at the corresponding location on the internal surface 74 of the other page of the same leaf 12. By exposing only the touch sensor 68 and not conductive traces 70, unintended activations are very unlikely.

In a variation of this implementation of resistive touch sensing, the touch sensor 68 can be covered by an overlay (e.g., an adhesive-backed indicia) having two spaced conductive regions in electrical contact with the electrodes 90, 92 of the touch sensor 68. By applying the overlay to the viewed face of the leaf 12, the appearance of the touch sensor 68 can be disguised.

Figure 8B:
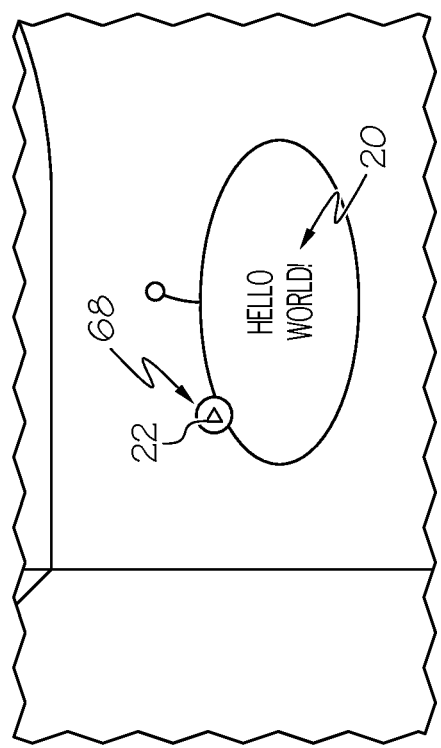
FIGS. 8A-8B are detailed illustrations of one implementation of resistive touch sensing in an interactive printed book.
Figure 8A:
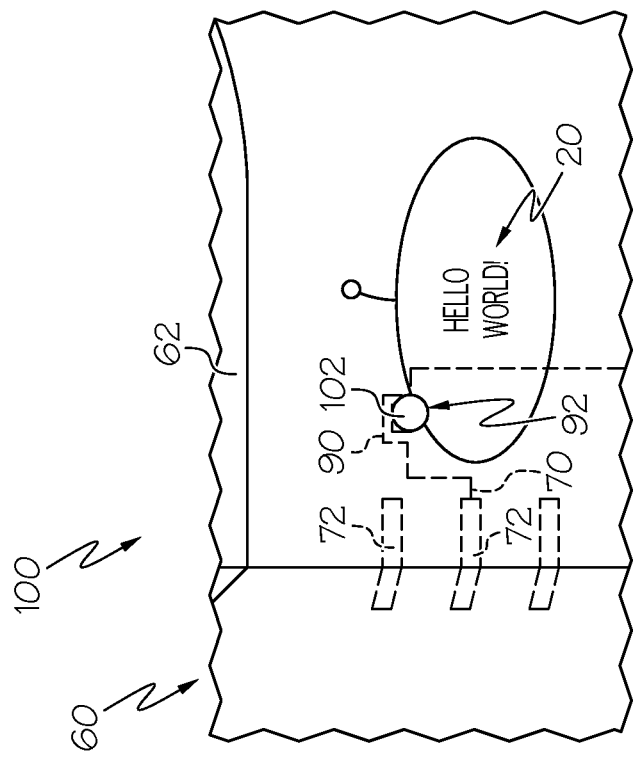

Yet another implementation of resistive touch sensing is illustrated in FIGS. 8A-8B. FIG. 8A illustrates a pre-assembly view of a portion of a printed and folded sheet 100 that, after assembly, will form the recto 60 and verso 62 of adjacent leaves 12 of an interactive printed book 10. In this implementation, prior to printing the internal surface 74 of sheet 100, a small perforation 102 is made in sheet 100 from the viewed face (e.g., in this case of verso 62) toward the internal surface 74 at the desired location of a touchpoint 22. As illustrated in FIG. 8A, conductive traces 70, conductive pads 72 and electrodes 90, 92 of a resistive touch sensor 68 are then printed onto the internal surface 74 of the same page as the touchpoint 22 (rather than on the internal surface 74 of the other page of the same leaf 12). Perforation 100 is made such that a small portion of the viewed surface of sheet 100 protrudes through perforation 102 to the internal surface 74 and is covered during the printing process by conductive ink forming electrodes 90, 92. After printing, sheet 100 is flattened (e.g., during the accordion-folding or adhesive application process) to return the portion of sheet 100 at the periphery of perforation 102 bearing electrodes 90, 92 to the viewed surface (e.g., verso 62), thus enabling the touch sensor 68 to be activated by touch of the user.

FIG. 8B illustrates the verso 62 depicted in FIG. 8A after assembly of the sheet 100 to form leaves 12 of an interactive printed book 10. As shown, if desired, a touchpoint 22 (i.e., an indicia of the location of the touch sensor 68) can optionally be printed on the internal surface 74 of the other page (i.e., the recto) of the same leaf 12 to further encourage selection of the touchpoint 22 and/or disguise the appearance of touch sensor 68. A similar appearance can alternatively be obtained by applying an overlay (e.g., adhesive backed sticker) sized to fit within the circumference of perforation 102.

Figure 9:
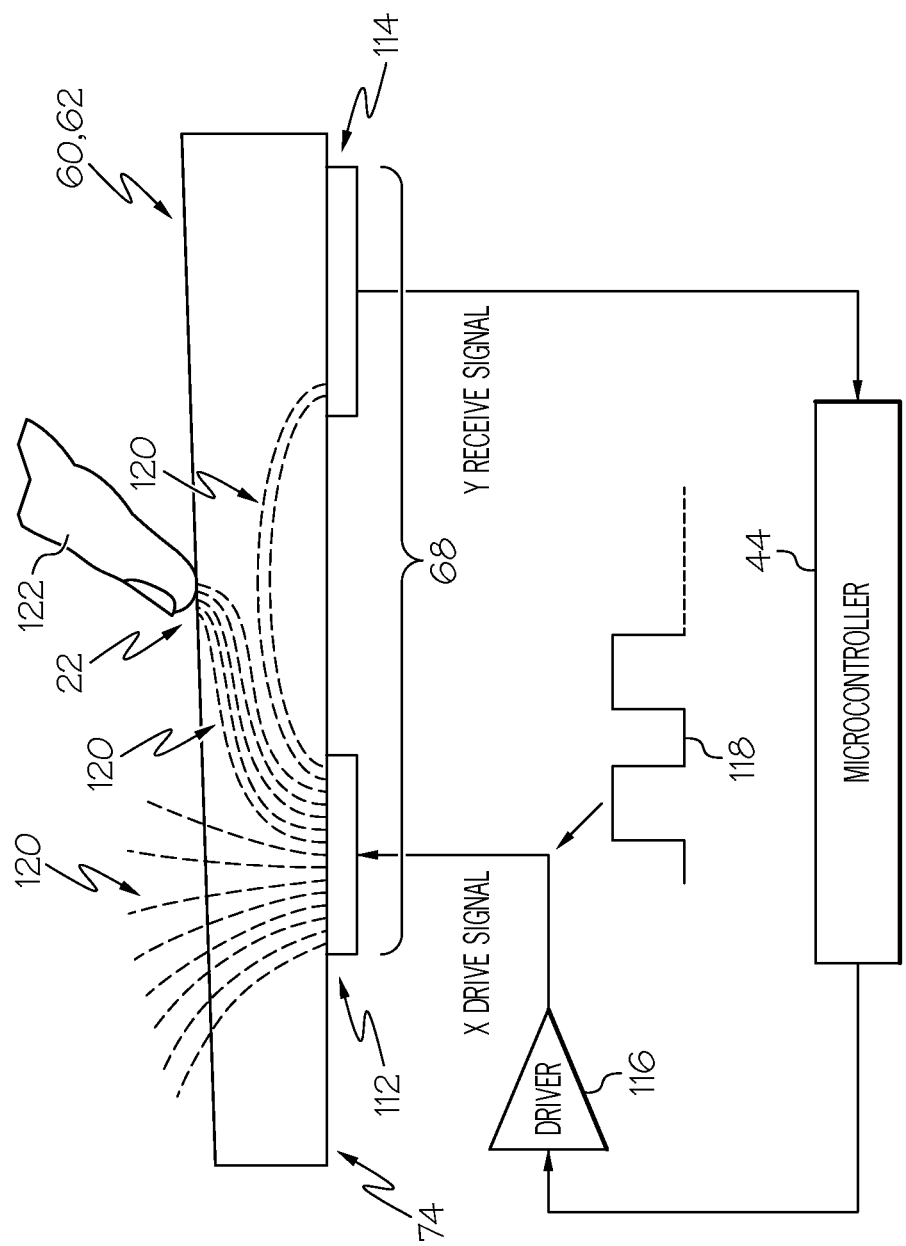
FIG. 9 depicts an exemplary touch sensor arrangement for projected capacitance touch sensing.

Referring now to FIG. 9, there is depicted another exemplary touch sensor arrangement adapted for Projected Capacitive Touch (PCAP) sensing. Specifically, FIG. 9 illustrates a section view of one page (i.e., verso 60 or recto 62) of a leaf 12 of an interactive printed book 10 in accordance with one embodiment.

As previously described, a touchpoint 22 is printed on the viewed face (e.g., verso 60 or recto 62) of a leaf 12, and spaced apart electrodes 112 and 114 of a touch sensor 68 are printed on the internal surface 74 of the same sheet in proximity to the location of touchpoint 22. Microcontroller 44 is coupled to electrode 112 by driver 116 (which in some embodiments can form a portion of microcontroller 44), and is further coupled to receive a signal from electrode 114. Microcontroller 44 applies a time-varying drive signal 118 to electrode 112 via driver 116, creating an electrostatic field 120 that delivers charge to electrode 114. When a conductive object 122, such as a human finger or stylus, is placed in proximity to touchpoint 22, conductive object 122 distorts the local electrostatic field at that point, resulting in a measurable change in charge delivered to electrode 114 by drive signal 118 and thus detection of the selection of touchpoint 22.

Figure 10:
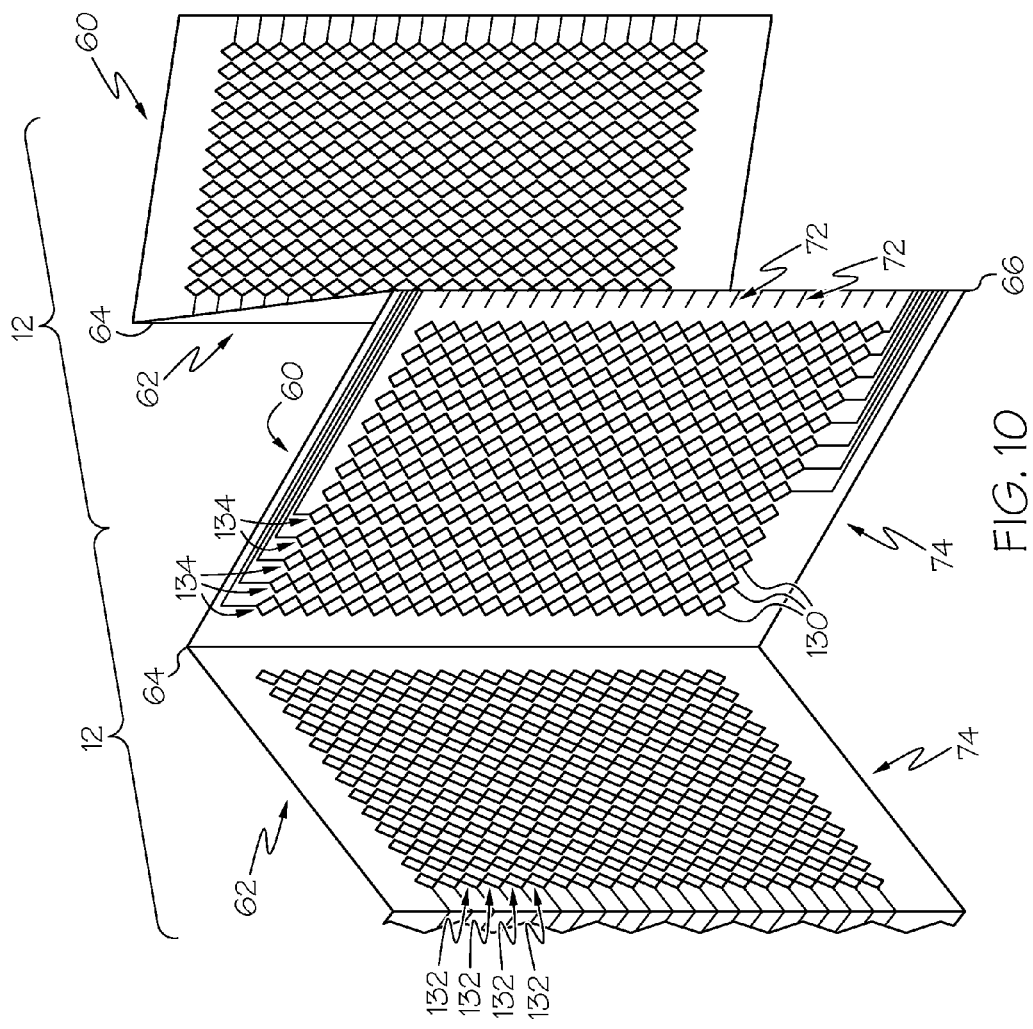
FIG. 10 illustrates one exemplary arrangement for projected capacitance touch sensors embedded within the leaves of an interactive printed book.
Figure 11:
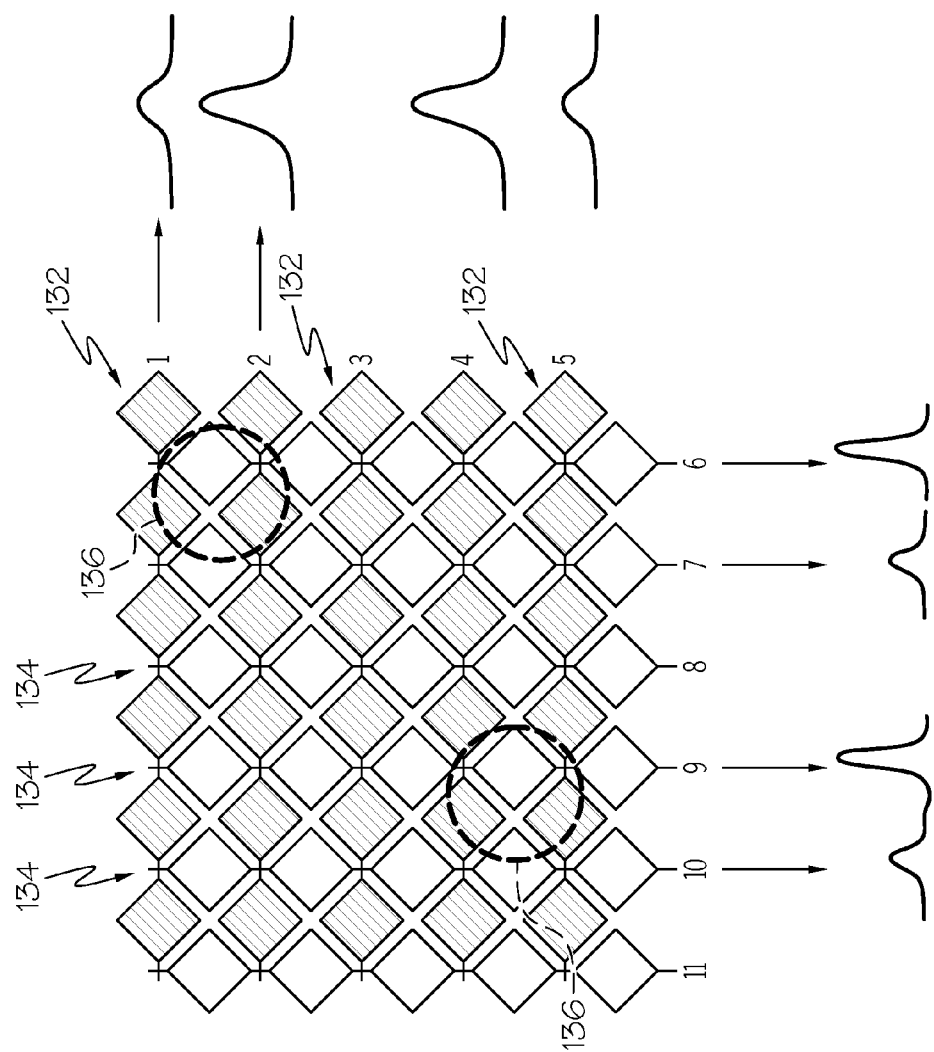
FIG. 11 depicts detection of touches on a printed page of an interactive printed book employing projected capacitance touch sensing.

With reference now to FIG. 10, one exemplary arrangement for electrodes of a projected capacitance touch sensor of an interactive printed book 10 is shown. In this embodiment, leaves 12 are formed by accordion-folding or otherwise joining multiple thicknesses of a printed sheet (e.g., paper, plastic, cardboard, cardstock, bookboard, foam or other dielectric material) as previously described with reference to FIGS. 3-4. In the illustrated embodiment, the internal surfaces 74 of each leaf 12 are printed with a grid of mutually interspersed diamond-shaped electrodes 130, with one internal surface 74 bearing a plurality of equally spaced rows 132 and the other internal surface 74 bearing a plurality of equally spaced columns 134. That is, the electrodes 130 within the rows 132 and columns 134 of a given leaf 12 do not overlap, but instead form a regular pattern as shown in FIG. 11. Rows 132 and columns 134 are insulated from each other by a non-conductive layer, for example, a non-conductive ink or other coating applied over one or both of the rows 132 and/or columns 134 or a separate sheet of dielectric material (e.g., paper, tape, plastic, foam, etc.) sandwiched within the leaf 12.

Microcontroller 44 applies a time-varying voltage signal to either rows 132 or columns 134, creating a uniform electrostatic field. As indicated in FIG. 11, the proximity or touch of a conductive object, such as a finger or stylus, at one or more points 136 (possibly simultaneously) overlying the grid of electrodes 130 changes the self-capacitance and/or mutual capacitance detected by microcontroller 44 for rows 132 and columns 134 proximate the point(s) 136, thus indicating the X and Y coordinates of each touch. In such implementations, microcontroller 44 can thus identify from the capacitance of electrodes 130 any point or collection of points that the user is touching on a leaf 12. However, depending on the arrangement of touchpoints 22 on leaves 12, the X and Y coordinates of a touch may not necessarily differentiate which page the reader is on (i.e., provide the Z coordinate). However, microcontroller 44 can determine this additional information (and can thus determine which of multiple presentations to initiate) using any of a variety of supplemental detectors, including photoresistors, flex sensors, or capacitive or resistive touch sensors as previously described. Alternatively, microcontroller 44 may simply be programmed to distinguish between pages by the X and Y coordinates of the touch and/or one or more preceding touches.

It should be appreciated that the foregoing descriptions of resistive and capacitive touch sensing arrangements are not intended to be exhaustive, but are instead intended to be merely exemplary of the large variety of methodologies that may be employed to perform touch sensing in accordance with the present invention. Appropriate design and/or programming of microcontroller 44 can further be employed to improve detection of selection of a touchpoint 22 and/or to reduce false activations. For example, in the self-capacitance embodiment of FIG. 6, false activation can be caused by a hand resting at the center of a two page spread. However, in this case, if microcontroller 44 observes more than one approximately simultaneous touchpoint activation, microcontroller 44 can safely assume no selection was intended and therefore does not initiate any presentation. Similarly, if microcontroller 44 observes multiple approximately simultaneous touchpoint selections that then change to a single touchpoint selection (e.g., as a palm or arm is lifted off of the center of the book), microcontroller 44 also treats this selection as unintentional and does not initiate a presentation. The incidence of such false activations can alternatively or additionally be reduced by employing a material at the spine that has poor dielectric properties. It should be noted that false activations are not as significant for embodiments relying on mutual capacitance (which are triggered by decreases in capacitance) since the placement of a hand or arm on the spine of the interactive printed book 10 would cause an increase in capacitance.

In embodiments employing capacitive touch sensing, another possible cause of a false detection of selection of a touchpoint 22 is a touch on the opposite side a leaf 12 from the touchpoint 22. With appropriate design or programming, microcontroller 44 can generally discern between a touch on the two pages of a leaf 12 because a touch on the page on which the touch sensor 68 is formed (i.e., the page bearing the touchpoint 22) gives a stronger touch signal. However, false detection can alternatively or additionally be reduced by including an insulating layer or coating between the two inner surfaces 74 of the leaf 12.

For embodiments employing capacitive or resistive touch sensing, moisture or wetness is also a potential concern that can likewise be handled by appropriate design and/or programming of microcontroller 44. The presence of moisture on a leaf 12 could appear to microcontroller 12 like a finger that was placed on a touchpoint 22 and never removed. If microcontroller 44 observes this syndrome, microcontroller 44 essentially recalibrates itself (e.g., after about 10-15 seconds) and looks for a further increase in capacitance (or voltage in the case of resistive sensing). Protection against moisture can also be further enhanced through application, before or after printing, of a waterproof coating covering either the entire page or just the touchpoints 22.

The content 20 of an interactive printed book 10 as herein described may relate to any subject, and the associated presentations initiated by the electronics package 40 of the interactive printed book 10 may contain or invoke any type of presentation that aids in comprehension of the content 20, enlivens the user experience, or provides a benefit to the user or another party associated with interactive printed book 10. As one example, an interactive printed book 10 may be a children's book containing words and/or illustrations, and the presentations associated with the various touchpoints 22 may enable the interactive printed book to "read itself" to a child and/or to provide any number of other interactive audio, visual and communication features. As another example, the interactive printed book 10 may be a children's book or a foreign language tutorial illustrating various words or concepts, and the presentations associated with the various touchpoints 22 could be the names and/or sounds made by or in conjunction with the illustrated words or concepts. As another example, the interactive printed book 10 may contain sheet music, and the various touchpoints 22 could activate auditory playback of digital sound files associated with a specific page, line or measure of music. In this way, a musician practicing on an instrument can hear how the music is intended to be played and can then associate that music with the notes on the page in order to learn the proper pitch, dynamics, and tempo of the music. In yet another example, the interactive printed book 10 may be an educational book, and the presentations may include audio and/or video clips providing more in-depth information about a subject that may be interest to the reader (e.g., an audio or video clip of or about a historical event (if a history text), a system of the human body (if a biology text), steps of a do-it-yourself project (if a how-to manual), etc.). In yet another embodiment, the interactive printed book 10 can be configured to enable the user to test his knowledge by posing questions in multiple-choice format in the printed content and then prompting the user to select a touchpoint 22 corresponding to the correct answer. The presentation associated with each touchpoint 22 can further be utilized to provide feedback regarding whether or not an answer provided by the user is correct. In another example, the interactive printed book 10 could include a biography of a musician or a text (e.g., lyrics or prose) written by a musician, and the presentations associated with the touchpoints 22 can include digital audio files of performances of musical works by that musician, for example, at different stages of his life or career. In yet another example, the interactive printed book 10 can be a Braille book, and the presentations associated with touchpoints 22 could provide assistance to a visually impaired person learning to read Braille. In some embodiments, the leaves 12 of interactive printed book 10 can include pop-up (or three-dimensional) features and tactile or textured surfaces.

An interactive printed book 10 as described herein supports a variety of different arrangements with respect to the storage and presentation of presentations associated with the touchpoints 22 of the interactive printed book 10. For example, the presentations can be stored locally within the electronics package 40 of the interactive printed book 10 and presented by the electronics package 40 itself or on an external electronic device 24. Alternatively or additionally, one or more of the presentations can be stored remotely on an external electronic device 24, and the electronics package 40 of the interactive printed book 10 can initiate presentation of such presentations by the interactive printed book 10 or on the external electronic device 24. Alternatively or additionally, one or more presentations can be a remotely stored resource (e.g., accessible on a website), and the electronics package 40 of interactive printed book 10 can initiate retrieval and/or presentation of the presentation (e.g., webpage) by the external electronic device 24, for example, utilizing HTTP, HTTPS, or FTP. Further, the presentation can include the transmission of data from interactive printed book 10 and/or external electronic device 24 to a remote website, for example, to enroll in a program, submit usage or survey data, request additional information, or initiate a purchase of a license or of goods. Thus, as one particular example, interactive printed book 10 may include printed content 20 containing images of goods or services and/or may contain samples of products for purchase, and the user may initiate purchase of a particular good, service, or product by selection of an associated touchpoint 22.

As has been described, the present invention provides an improved interactive printed article that supports touch activation of presentations. Although described with reference to an embodiment in which the interactive printed article is an interactive printed book, those skilled in the art will appreciate that the teachings herein may be applied to other interactive printed articles, such as magazines, catalogs, etc.

While the invention has been particularly shown and described with reference to a preferred embodiment, it will be understood by those skilled in the art that various changes in form and detail may be made therein without departing from the spirit and scope of the invention. For example, although illustrated and described herein as disposed in a recess in the back cover of the interactive printed book, the electronics package can alternatively or additionally be disposed in a front cover, spine and/or page of the interactive printed book. Further, as employed herein, the term "exemplary" is defined to mean one example of an aspect or feature, rather than the best or only preferred embodiment of that aspect or feature.

I claim:

1. An interactive printed article, comprising:
a board book, including:
a plurality of leaves each comprising paperboard and having a touch sensor incorporated therein and including first and second sheet portions of multiple different sheets, wherein each of the multiple different sheets includes:
a first sheet portion and a second sheet portion having a fold therebetween defining a bound edge;
a viewed surface having a touchpoint proximate the touch sensor and on which content is printed;
an inner surface on an opposite side of the sheet from the viewed surface;
a plurality of conductive pads formed on the inner surface at and interconnected across the fold at the bound edge; and
a conductive trace electrically coupled to the touch sensor, wherein the conductive trace is formed on at least one of a set consisting of a surface of the paperboard and the inner surface of the sheet;
wherein each of the plurality of leaves is electrically interconnected to each of its one or more adjacent leaves to form multiple conductive paths through all the plurality of leaves by direct contact of corresponding ones of the plurality of conductive pads on the one or more adjacent leaves;
an electronics package, electrically coupled to the conductive trace via one of the multiple conductive paths, that initiates presentation of a particular presentation corresponding to the touchpoint in response to detection via the touch sensor of selection of the touchpoint; and
a cover containing the plurality of leaves and the electronics package, wherein all of the plurality of leaves are bound to the cover such that the viewed surface of each sheet is viewable to the fold.

2. The interactive printed article of claim 1, wherein the touch sensor is formed of conductive ink.

3. The interactive printed article of claim 1, wherein the touch sensor is disposed on the inner surface.

4. The interactive printed article of claim 1, wherein the sheet has a perforation therethrough at a location of the touch sensor.

5. The interactive printed article of claim 1, wherein:
the touchpoint is disposed on the viewed surface of the first sheet portion and the touch sensor is disposed on the inner surface of the second sheet portion opposite the touchpoint.

6. The interactive printed article of claim 5, wherein the first sheet portion has a perforation therethrough at a location of the touch sensor.

7. The interactive printed article of claim 1, wherein the cover includes a recess housing the electronics package.

8. The interactive printed article of claim 1, wherein the touch sensor is a resistive touch sensor.

9. The interactive printed article of claim 1, wherein the touch sensor is a capacitive touch sensor.

10. The interactive printed article of claim 1, wherein the touch sensor is a projected capacitance touch sensor.

11. The interactive printed article of claim 10, wherein the touch sensor includes a plurality of electrodes arranged in a grid on the inner surface.

12. The interactive printed article of claim 1, wherein:
the touch sensor includes first and second electrodes;
the conductive trace is a first conductive trace coupled to the first electrode;
the inner surface has a second conductive trace formed thereon electrically coupled to the second electrode of the touch sensor; and
the electronics package detects selection of the touchpoint via the touch sensor only in response to detection of the selection utilizing both the first and second electrodes.

13. The interactive printed article of claim 1, wherein:
the touch sensor is a first touch sensor disposed on the inner surface of the first sheet portion;
a particular leaf among the plurality of leaves further includes a second touch sensor disposed on the inner surface of the first sheet portion; and
the conductive trace is disposed on the inner surface of the first sheet portion and is electrically coupled to both the first touch sensor and the second touch sensor.

14. A system, comprising:
an interactive printed article in accordance with claim 1; and
an external electronic device communicatively coupled to the electronics package that is configured to retrieve a particular presentation via a network and to present the particular presentation in response to initiation of the particular presentation by the electronics package.

15. The interactive printed article of claim 1, wherein:
the conductive trace of at least one of the plurality of leaves is formed on a surface of the paperboard.

16. The interactive printed article of claim 15, wherein the touch sensor is formed on the surface of the paperboard.

17. The interactive printed article of claim 1, wherein:
the conductive trace of at least one of the plurality of leaves is formed on the inner surface of the sheet.

18. The interactive printed article of claim 15, wherein the touch sensor is formed on the inner surface of the sheet.

19. The interactive printed article of claim 1, wherein each of the plurality of leaves includes two sheets of paperboard joined together.

20. The interactive printed article of claim 1, wherein each of the plurality of leaves includes two sheets joined to a paperboard core.

21. A method of making an interactive printed article that is a board book, the method comprising:
forming each of a plurality of leaves each comprising paperboard and having a touch sensor incorporated therein and including first and second sheet portions of multiple different sheets, wherein each of the multiple different sheets includes:
- a first sheet portion and a second sheet portion having a fold therebetween defining a bound edge;
- a viewed surface having a touchpoint proximate the touch sensor and on which content is printed;
- an inner surface on an opposite side of the sheet from the viewed surface;
- a plurality of conductive pads formed on the inner surface at and interconnected across the fold at the bound edge; and
- a conductive trace electrically coupled to the touch sensor, wherein the conductive trace is formed on at least one of a set consisting of a surface of the paperboard and the inner surface of the sheet;

electrically interconnecting each of the plurality of leaves is to each of its one or more adjacent leaves to form multiple conductive paths through all the plurality of leaves by direct contact of corresponding ones of the plurality of conductive pads on the one or more adjacent leaves;

electrically coupling to the conductive trace via one of the multiple conductive paths an electronics package configured to initiate presentation of a particular presentation corresponding to the touchpoint in response to detection via the touch sensor of selection of the touchpoint; and packaging the plurality of leaves and the electronics package in a cover, wherein the packaging includes binding all of the plurality of leaves to the cover such that the viewed surface of each sheet is viewable to the fold.

* * * * *